United States Patent [19]

Lindeman

[11] Patent Number: 5,597,313
[45] Date of Patent: Jan. 28, 1997

[54] ELECTRICAL CONNECTORS

[75] Inventor: Richard J. Lindeman, Wood Dale, Ill.

[73] Assignee: Labinal Components and Systems, Inc., Bensenville, Ill.

[21] Appl. No.: 361,448

[22] Filed: Dec. 21, 1994

Related U.S. Application Data

[63] Continuation of Ser. No. 647,907, Jan. 30, 1991, abandoned, which is a continuation-in-part of Ser. No. 518,295, May 3, 1990, Pat. No. 5,004,427, which is a continuation of Ser. No. 297,303, Jan. 13, 1989, abandoned, which is a division of Ser. No. 947,317, Dec. 29, 1986, Pat. No. 4,806,110, which is a continuation-in-part of Ser. No. 876,179, Jun. 19, 1986, Pat. No. 4,710,133, said Ser. No. 647,907, Jan. 30, 1991, is a continuation-in-part of Ser. No. 406,142, Sep. 12, 1989, Pat. No. 5,013,249, and a continuation-in-part of Ser. No. 375,588, Jul. 5, 1989, Pat. No. 4,992,053, and a continuation-in-part of Ser. No. 352,499, May 16, 1989, Pat. No. 4,988,306, said Ser. No. 406,142, Sep. 12, 1989, is a continuation-in-part of Ser. No. 297,303, Jan. 13, 1989, abandoned, said Ser. No. 361,448, Dec. 21, 1994, is a continuation-in-part of Ser. No. 241,663, May 11, 1994, which is a continuation of Ser. No. 647,865, Jan. 30, 1991.

[51] Int. Cl.⁶ .................................................. H01R 9/09
[52] U.S. Cl. ............................................................ 439/66
[58] Field of Search .............................. 439/65, 66, 91, 439/101, 591, 608

[56] References Cited

U.S. PATENT DOCUMENTS

| Re. 27,089 | 3/1971 | Sear et al. ........................ 317/101 |
| 2,153,177 | 4/1939 | Ecker . |

(List continued on next page.)

FOREIGN PATENT DOCUMENTS

| 0072063A1 | 2/1983 | European Pat. Off. . |
| 73957 | 3/1983 | European Pat. Off. . |
| 0254385A1 | 4/1987 | European Pat. Off. . |
| 0243021 | 10/1987 | European Pat. Off. . |
| 0248521 | 12/1987 | European Pat. Off. . |
| 0314481 | 5/1989 | European Pat. Off. . |
| 2550894A1 | 2/1985 | France . |
| 2620267A1 | 5/1976 | Germany . |
| 2743406 | 5/1978 | Germany . |
| 143334 | 8/1980 | Germany . |
| 8517334 | 6/1985 | Germany . |
| 62-165958 | 7/1987 | Japan . |
| 2098412 | 11/1982 | United Kingdom . |
| 2160719 | 12/1985 | United Kingdom . |
| 2163305 | 2/1986 | United Kingdom . |
| 2193604 | 2/1988 | United Kingdom . |

OTHER PUBLICATIONS

EPO Search Report Mailed 01 Sep., 1995 (3 pp.).
Application Ser. No. 07/738,051 filed Jul. 31, 1991 by or on behalf of Robert P. Stimson and naming Richard J. Lindeman as an inventor.
Application Ser. No. 297,303 filed Jan. 13, 1989 (abandoned) of Richard J. Lindeman.
Application Ser. No. 08/241,663 filed Jan. 13, 1989 (abandoned) of Richard J. Lindeman.
Applicatioon Ser. No. 08/241,663 filed May 11, 1994 of Richard J. Lindeman (Drawings only).
High–Density Printed Circuit Connector, Callaway et al., IBM Tech. Discl. bull. vol. 8, No. 3, Aug. 1965, pp. 351–352.
Teradyne Technical bulletin 237, p. 8 with 339–17. LC and Jan. 29, 1985 noted on it.
"Shielded In–Line Electrical Multiconnector", Straus, IBM Technical Disclosure Bulletin, vol. 10, No. 3, Aug., 1967, p. 703.

*Primary Examiner*—David L. Pirlot
*Assistant Examiner*—Daniel Wittels
*Attorney, Agent, or Firm*—Leydig, Voit & Mayer, Ltd.

[57] ABSTRACT

Various electrical connectors include conductor elements extending through a support body in parallel insulated relation to one another and to adjacent grounds of very low inductance and resistance. The relationship of the conductor elements to the planar grounds is such as to obtain a characteristic impedance which is the same for all signal paths and which is uniform along the length of each conductor element.

21 Claims, 10 Drawing Sheets

U.S. PATENT DOCUMENTS

| | | |
|---|---|---|
| 2,853,656 | 9/1959 | Dowds . |
| 3,074,046 | 1/1963 | Sullivan . |
| 3,077,511 | 1/1963 | Bohrer et al. . |
| 3,200,297 | 8/1965 | Gibson . |
| 3,334,325 | 8/1967 | Conrad et al. . |
| 3,384,864 | 5/1968 | Schwartz . |
| 3,398,232 | 8/1968 | Hoffman ................................ 174/68.5 |
| 3,419,844 | 12/1968 | Schmued . |
| 3,509,296 | 4/1970 | Harshman et al. . |
| 3,513,434 | 5/1970 | Zielke . |
| 3,616,532 | 11/1971 | Beck . |
| 3,660,726 | 5/1972 | Ammon et al. .......................... 317/101 |
| 3,680,037 | 7/1972 | Nellis et al. . |
| 3,767,959 | 10/1973 | Toma et al. . |
| 3,795,037 | 3/1974 | Luttmer . |
| 3,795,047 | 3/1974 | Abolafia et al. . |
| 3,858,958 | 1/1975 | Davies . |
| 3,862,790 | 1/1975 | Davies et al. . |
| 3,871,728 | 3/1975 | Goodman . |
| 3,881,799 | 5/1975 | Elliott et al. . |
| 3,885,848 | 5/1975 | Brouneus . |
| 3,904,934 | 9/1975 | Martin . |
| 3,922,050 | 11/1975 | Lettini . |
| 3,932,932 | 1/1976 | Goodman ................................. 29/625 |
| 3,971,610 | 7/1976 | Buchoff et al. . |
| 3,992,652 | 11/1976 | Blaisdell . |
| 4,029,375 | 6/1977 | Gabrielian . |
| 4,064,623 | 12/1977 | Moore ..................................... 29/629 |
| 4,068,910 | 1/1978 | Brown . |
| 4,082,399 | 4/1978 | Barkhuff . |
| 4,130,334 | 12/1978 | Anderson . |
| 4,130,934 | 12/1978 | Asick . |
| 4,133,592 | 1/1979 | Cobaugh et al. . |
| 4,179,170 | 12/1979 | Splitt . |
| 4,209,481 | 6/1980 | Kashiro et al. ........................... 264/24 |
| 4,223,968 | 9/1980 | Kawabata . |
| 4,232,929 | 11/1980 | Zobawa . |
| 4,236,776 | 12/1980 | Wellington . |
| 4,243,283 | 1/1981 | McSparran . |
| 4,257,661 | 3/1981 | Dalamangas et al. . |
| 4,360,858 | 11/1982 | Fahling . |
| 4,386,814 | 6/1983 | Asick . |
| 4,389,080 | 6/1983 | Clark . |
| 4,394,712 | 7/1983 | Anthony ................................. 361/411 |
| 4,395,081 | 7/1983 | Melys . |
| 4,427,247 | 1/1984 | Petersen . |
| 4,451,099 | 5/1984 | Bricker . |
| 4,451,107 | 5/1984 | Dola . |
| 4,501,459 | 2/1985 | Chandler et al. . |
| 4,511,196 | 4/1985 | Shuler et al. . |
| 4,516,815 | 5/1985 | Venable . |
| 4,518,209 | 5/1985 | Negley . |
| 4,528,500 | 7/1985 | Lightbody et al. ........................ 324/73 |
| 4,534,602 | 8/1985 | Bley . |
| 4,550,960 | 11/1985 | Asick . |
| 4,571,012 | 2/1986 | Bassler et al. . |
| 4,571,014 | 2/1986 | Robin et al. . |
| 4,571,015 | 2/1986 | Mueller . |
| 4,572,600 | 2/1986 | Nieman . |
| 4,574,331 | 3/1986 | Smolley . |
| 4,581,679 | 4/1986 | Smolley ..................................... 439/66 |
| 4,582,374 | 4/1986 | Conrad . |
| 4,582,385 | 4/1986 | Couper . |
| 4,593,961 | 6/1986 | Cosmos . |
| 4,620,761 | 11/1986 | Smith et al. . |
| 4,636,018 | 1/1987 | Stillie . |
| 4,645,278 | 2/1987 | Yevak, Jr. et al. . |
| 4,655,518 | 4/1987 | Johnson et al. . |
| 4,659,155 | 8/1987 | Walkup et al. . |
| 4,686,607 | 8/1987 | Johnson . |
| 4,688,864 | 8/1987 | Sorel . |
| 4,705,332 | 11/1987 | Sadigh-Benzadi . |
| 4,707,657 | 11/1987 | Boegh-Petersen ...................... 324/158 |
| 4,710,133 | 12/1987 | Lindeman ................................. 439/92 |
| 4,720,770 | 6/1988 | Jameson .................................. 361/387 |
| 4,733,172 | 3/1988 | Smolley . |
| 4,791,722 | 12/1988 | Miller, Jr. ................................ 29/850 |
| 4,806,110 | 2/1989 | Lindeman ................................ 439/108 |
| 4,820,170 | 4/1989 | Redmond et al. ......................... 439/66 |
| 4,820,376 | 4/1989 | Lambert et al. .......................... 156/643 |
| 4,843,313 | 6/1989 | Walton .................................... 324/158 |
| 4,858,313 | 8/1989 | Bowlin ..................................... 29/883 |
| 4,859,806 | 8/1989 | Smith . |
| 4,889,496 | 12/1989 | Neidich . |
| 4,902,857 | 2/1990 | Cranston et al. .......................... 174/94 |
| 4,961,709 | 10/1990 | Noschese ................................... 439/66 |
| 4,988,306 | 1/1991 | Hopfer, III et al. ....................... 439/66 |
| 4,992,053 | 2/1991 | Lindeman et al. ......................... 439/66 |
| 5,004,427 | 4/1991 | Lindeman ................................. 439/101 |
| 5,007,843 | 4/1991 | Smolley ..................................... 439/66 |
| 5,013,249 | 5/1991 | Lindeman et al. ......................... 439/66 |
| 5,019,945 | 5/1991 | Smolley ................................... 361/412 |
| 5,037,332 | 8/1991 | Wilson .................................... 439/608 |
| 5,068,602 | 11/1991 | Mielke .................................... 324/158 |
| 5,089,880 | 2/1992 | Meyer et al. ............................. 357/75 |
| 5,121,299 | 6/1992 | Frankeny et al. ........................ 361/413 |
| 5,127,837 | 7/1992 | Shah et al. ................................ 439/71 |
| 5,129,142 | 7/1992 | Bindra et al. .............................. 29/852 |
| 5,155,905 | 10/1992 | Miller, Jr. ................................ 29/843 |
| 5,167,512 | 12/1992 | Walkup .................................... 439/66 |

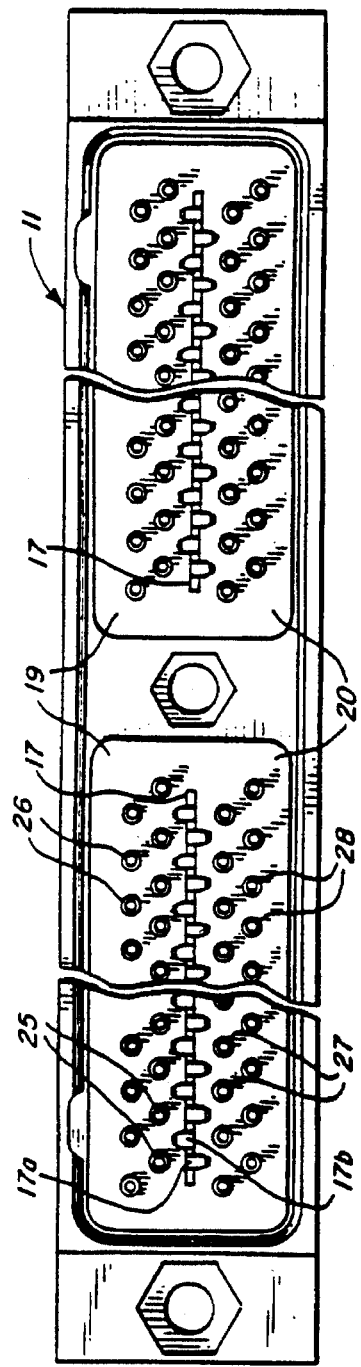
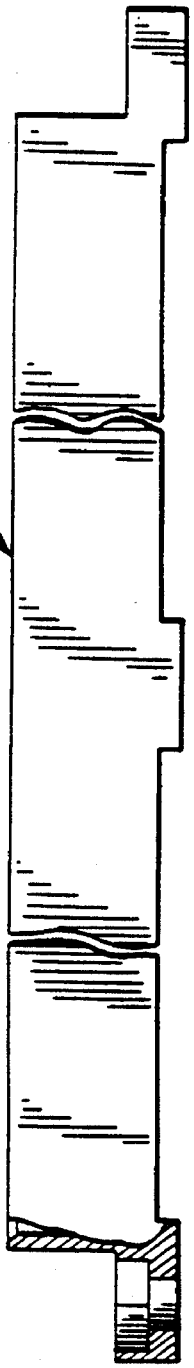
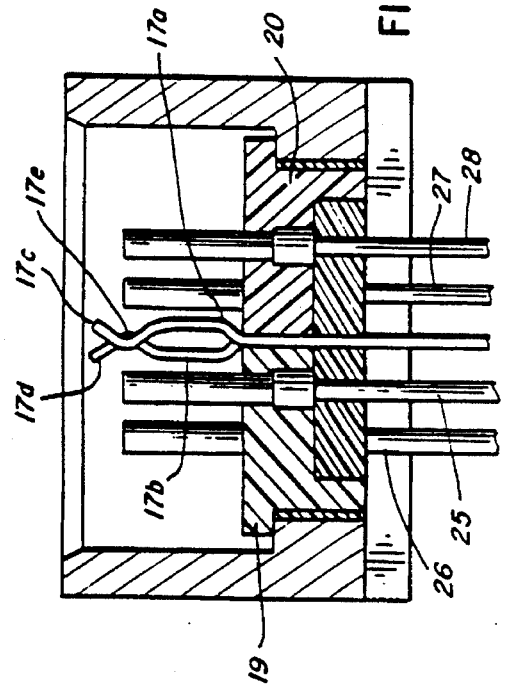
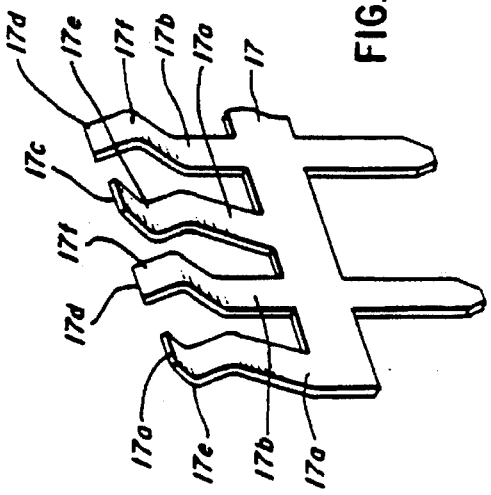
FIG. 2
FIG. 3
FIG. 4
FIG. 5

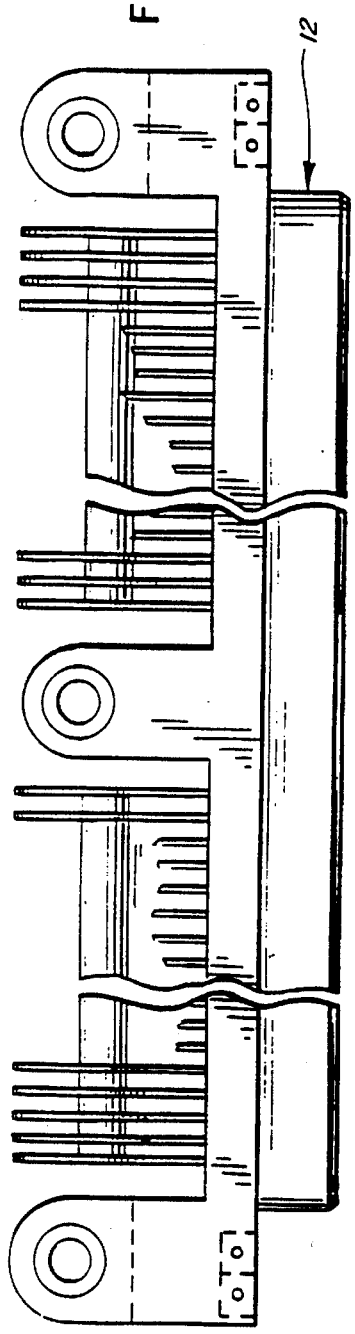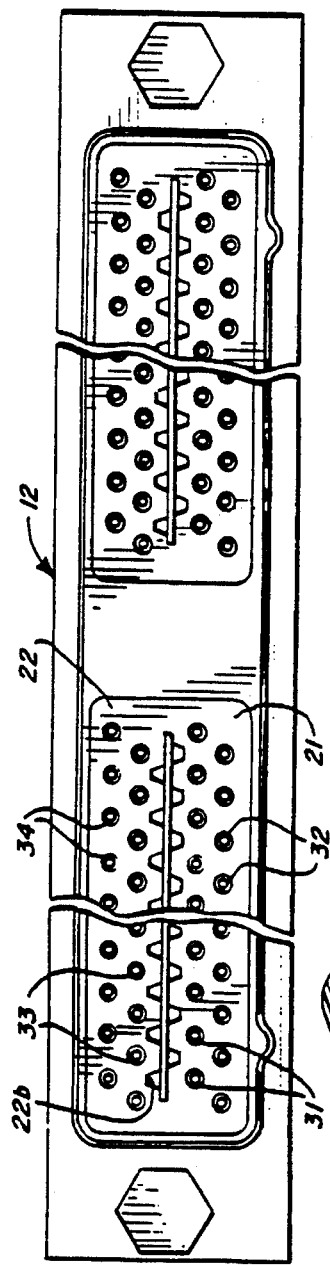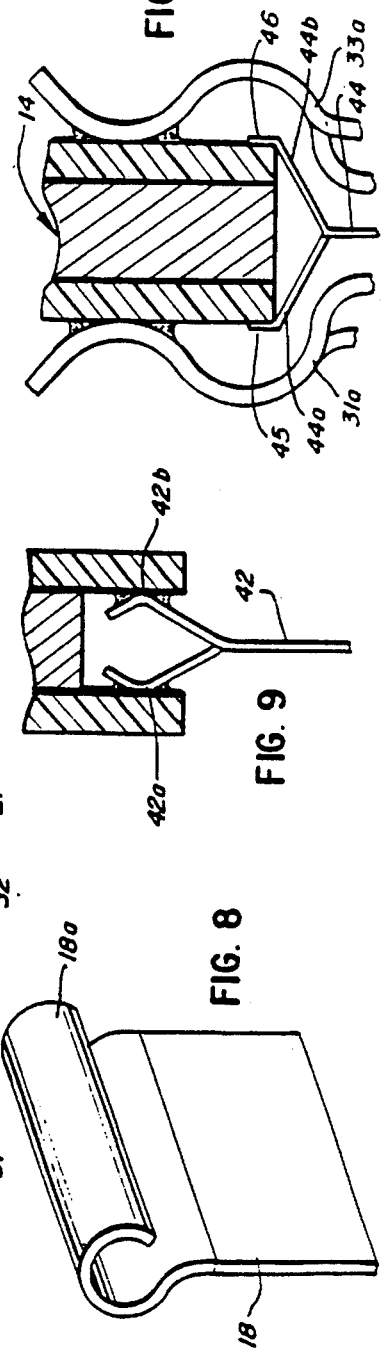

ELECTRICAL CONNECTORS

This is a continuation of application Ser. No. 647,907 filed Jan. 30, 1991 (now abandoned) that continues subject matter of the application of Richard Jay Lindeman, Ser. No. 518,295, filed May 3, 1990 (issued as U.S. Pat. No. 5,004, 427 on Apr. 2, 1991), and which is a continuation of an application now abandoned of Richard Jay Lindeman, Ser. No. 297,303, filed Jan. 13, 1989 as a division of an application of Richard J. Lindeman, Ser. No. 947,317, filed Dec. 29, 1986 (issued Feb. 21, 1989 as Pat. No. 4,806,110). The application Ser. No. 947,317 continues subject matter of an application of Richard J. Lindeman, filed Jun. 19, 1986, Ser. No. 876,179 (issued as U.S. Pat. No. 4,710,133 on Dec. 1, 1987). Said application Ser. No. 647,907 also continues subject matter of the application of Richard J. Lindeman, et al., Ser. No. 406,142, filed Sep. 12, 1989 (issued as U.S. Pat. No. 5,013,249 on May 7, 1991), and subject matter of the application of Richard Jay Lindeman and Saeed U. Zafar, Ser. No. 375,588, filed Jul. 5, 1989 (issued as U.S. Pat. No. 4,992,053) on Feb. 12, 1991, and subject matter of the application of Albert Nicholas Hopfor, III and Richard J. Lindeman, Ser. No. 352,499, filed May 16, 1989 (issued as U.S. Pat. No. 4,988,306 on Jan. 29, 1991). Said application Ser. No. 406,142 also continues subject matter of the application Ser. No. 297,303, said application Ser. No. 352,499 and said application Ser. No. 375,588. Said application Ser. No. 375,588 also continues subject of said application Ser. No. 352,499. The disclosures of said applications are incorporated herein by reference. This application also continues subject matter which is disclosed in my copending application Ser. No. 241,663, filed May 11, 1994, which is a continuation of my application Ser. No. 647,865, filed Jan. 30, 1991, each of which also continues subject matter of the other applications recited above.

BACKGROUND OF THE INVENTION

1. Field of the Invention

This invention relates to electrical connectors and more particularly to electrical connectors which are usable for installation between circuit boards or other components for propagation of high frequency signals as well as for transmission of electrical power, control or reference voltages therebetween. The connectors of the invention are readily installed and are highly efficient and reliable, while being readily and economically manufacturable.

2. Background of the Prior Art

Many different types of electrical connectors have heretofore been used or proposed in the prior art, including electrical connectors which utilize wadded conductor contacts or buttons which generally include "wads" or "buttons" of fine wire which are placed in holes in a carrier of insulating material in position to be compressed between the surfaces of a pair of conductors to be connected. Such conductive wads are advantageous in that they have very low resistance to current and also in that they have very low inductance and are otherwise advantageous for propagation of very high frequency signals.

However, arrangements of the prior art have left something to be desired, particularly with respect to signal transmission characteristics and with respect to providing low-loss, efficient and reliable transmission of signals between circuit boards.

SUMMARY OF THE INVENTION

This invention was evolved with the general object of improving upon the prior art and more particularly for providing connectors which can be readily used for low-loss transmission of signals between separated circuit boards or other components, while being efficient and reliable and manufacturable at reasonably low cost.

A further object of the invention is to provide connectors which have optimal electrical characteristics particularly with respect to efficient and reliable propagation of high frequency signals between circuit boards or the like.

This application continues subject matter of the aforementioned applications relating to features of a connector structure for propagating signals between very high speed integrated circuits, such features being operative to overcome problems discovered and recognized in connection with prior constructions. In particular, it was found that ground connections tend to develop electrostatic charges when attempts are made to propagate high volumes of such very high frequency signals at very high speeds. A shift in voltage between ground planes of two interconnected circuits may result in loss of reference levels in electronic circuitry, thus rendering computers and the like inoperative. Mismatched impedances between circuitry and connectors cause reflections and the production of undesirable standing wave phenomena, with corresponding errors in transmitting data, in the case of transmitting digital signals. It is also found that cross talk between signal paths increases with frequency and with decreases in spacing therebetween. This problem is affected to a substantial extent by the characteristics of the ground connection which is common to the signal paths. Inductive reactances for a given path length increase with frequency and if the ground connection has a substantial reactance, it can cause problems with high frequency signal propagation or high velocity pulse signal propagation. This had not been recognized because the ground paths of conventional connectors have inductive reactances which have not produced a problem when transmitting signals at relatively low frequencies.

Typically, one or more connector pins had been used in the past for ground connections and, in some cases, each pin used for signal transmission may have an associated adjacent pin used for a ground connection, in an attempt to minimize cross talk problems. It was found that such does not provide an adequate solution because there may nevertheless be substantial impedances in the ground connections and also, this solution requires many more connector pins. Moreover, if the number of ground pins were increased so as to use two or more pins for each signal pin, it would impose severe space limitations as well as increasing insertion forces.

Another problem of prior constructions related to the impedance characteristics of the signal paths. Each signal path of an electrical connector may be considered as an electrical transmission line having a certain characteristic impedance determined by its resistance, inductance and distributed capacitance per unit length. At relatively low signal transmission frequencies, the actual impedance of the path is not usually important. However, at high frequencies, the path may produce reflections, resonances and standing wave phenomena when there is a substantial mismatch between the characteristic impedance of the path and the characteristic impedances of the circuits connected thereto. It is also to be observed that it is especially desirable that the characteristic impedances of all paths be substantially the same, so as to facilitate design of the connected circuits.

In connectors in accordance with this invention, very high frequency signals are propagated from one circuit to another through a plurality of contact elements which are disposed in spaced parallel relation and a conductive ground path is provided in spaced parallel relation to each of the contact elements, the ground path being of very low inductance and resistance which provides a very low impedance and which prevents the build-up of any potential difference between the interconnected circuits. The result is a very substantial increase in the speed and volume of data transmission which can be accommodated in a connector of a given size. The arrangement also minimizes common ground path impedances and cross-talk effects between adjacent signal paths. Another feature of the connectors of this invention relate to constructions which are such as to achieve a uniform characteristic impedance with the characteristic impedances of all paths being substantially the same so as to facilitate design of the connected circuits. A further feature relates to the use of a plurality of ground conductors which need not be connected directly together but which are so connected electrically as to provide a very low AC impedance between each such ground conductor and each other ground conductor. Such conductors may be used with each other and/or with an outer shell for transmission of DC supply voltages, reference voltages or on-off control voltages or for other purposes, without an adverse effect on the propagation of very high frequency signals through the signal elements.

This application also relates to connectors which may be sandwiched between stacked circuit boards and to features of construction in which resilient elements such as resilient wadded elements are used in providing conductive interconnect means to propagate very high frequency signals between circuit boards with a conductive ground being provided in adjacent relation to each conductive interconnect means.

Further features of the invention relate to constructions which achieve the advantages of the constructions of the aforementioned prior applications while achieving additional important advantages, especially in connection with providing propagation paths in large numbers and/or in high density relation in connectors of small size and in connection with facilitating the connection of a plurality of circuit boards in stacked relation.

In accordance with more specific features of the invention, connectors are provided each of which may be sandwiched between opposed faces of a pair of circuit boards, a plurality of the connectors being usable in providing signal propagation paths between circuits of a stack of circuit boards. Each connector includes a plurality of conductive interconnect means having opposite ends engageable with conductive pads on a pair of the circuit boards. Such conductive interconnect means, each of which may include a resilient wadded element, are supported in openings of a support structure which provides conductive ground means in adjacent relation to each opening and to the conductive interconnect means supported therein, the conductive ground means being arranged for connection to grounding elements of the circuit boards. The support structure is preferably in the form of a plate-like structure which has a plurality of interconnect openings therethrough for support of a plurality of conductive interconnect means therein and which includes conductive material arranged for connection to circuit board grounding elements and for providing a ground in adjacent insulated relation to each conductive interconnect means. A high density of propagation paths is possible and the arrangement is not limited to use of any particular pattern of interconnect means. The openings may be arranged in an array in a single row or preferably in a multi-dimensional array having, for example, a plurality of parallel rows or in any type of regular or irregular pattern as may be suitable for providing selectable propagation paths between a pair of circuit boards. It should be noted that the term "circuit board" as used herein is not limited to any particular type of board but is used in a general sense to include any type of support structure for electrically conductive elements engageable by conductive interconnect means of the connectors of the invention.

In one embodiment, the support structure includes plate means of a highly conductive material such as aluminum which has opposite surface portions engageable with circuit board grounding elements and which has interconnect openings therethrough, together with means of an insulating dielectric material in each opening for support of the conductive interconnect means therein. With this arrangement each conductive interconnect means may be substantially completely surrounded by a conductive ground and a high degree of isolation between propagation paths is obtained.

In another embodiment, the support structure includes a plate of an insulating dielectric material having a plurality of interconnect openings in which the conductive interconnect means are disposed and grounding means of a conductive material are secured to the plate and are arranged for connection to circuit board grounding pads while providing grounds in adjacent relation to each conductive interconnect means. Preferably, each grounding opening receives conductive material which extends through the plate in adjacent relation to an interconnect opening. This arrangement, although not providing complete isolation, may still provide a high degree of isolation and may also facilitate economic manufacture of the connectors. By way of example, the conductive material may be provided in each grounding opening through a plating process, thereby providing "plated-through" grounding elements.

This invention contemplates other objects, features and advantages which will become more fully apparent from the following detailed description taken in conjunction with the accompanying drawings.

BRIEF DESCRIPTION OF THE DRAWINGS

FIG. 2 is a plan view of the receptacle connector of FIG. 1, on a reduced scale and with intermediate portions broken away;

FIG. 3 is a side elevational view of the receptacle connector of FIG. 2;

FIG. 4 is a sectional view of the receptacle connector, on a scale larger than that of FIG. 2 but smaller than theft of FIG. 1, particularly showing the relationship of engagement fingers of tines of the connector;

FIG. 5 is a fragmentary perspective view of a ground plate of the receptacle connector;

FIG. 6 is a side elevational view of the plug connector of FIG. 1 but on a reduced scale;

FIG. 7 is a plan view of the plug connector as shown in FIG. 6;

FIG. 8 is a fragmentary view of a portion of a ground plate of the plug connector;

FIG. 9 is a view illustrating a modified ground plate for the plug connector;

FIG. 10 is a view illustrating another modified ground plate for the plug connector;

DESCRIPTION OF PREFERRED EMBODIMENTS

Figure 1:
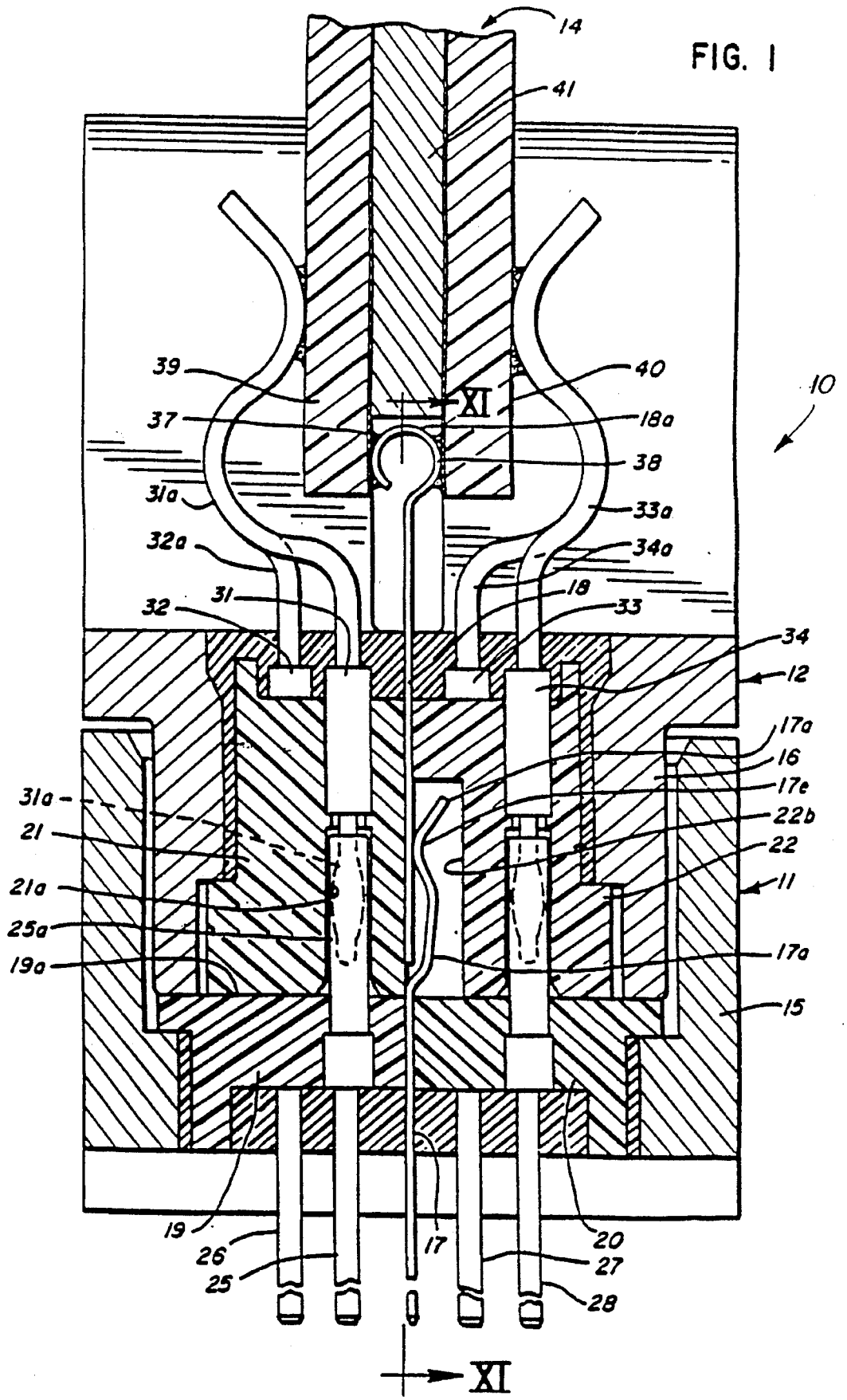
FIG. 1 is a transverse sectional view of a pair of mated connectors constructed in accordance with the principles of this invention, the lower connector of FIG. 1 being a receptacle and the upper connector being a plug an being shown connected to a circuit board assembly.

Reference numeral 10 generally designates one form of connector assembly which is constructed in accordance with the principles of this invention and which includes mating connectors 11 and 12 for connection circuit boards 13 and 14. Other forms of connectors of the invention, as illustrated in FIGS. 12–26 are arranged to be sandwiched between circuit boards for providing connections therebetween.

In the connector assembly 10, the connector 11, as shown, is adapted to be mounted on and form part of the board 13 which may be a mother board 13 and the connector 12 is adapted to receive and to be secured to the circuit board 14 which may be a daughter board. It will be understood that the connectors 11 and 12, and the novel features thereof which form part of the invention, may be used in other configurations and for other purposes.

The connector 11 as shown includes an outer shell 15 which receives an outer shell 16 of the connector 12, the connector 11 being thus in the form of a receptacle and the connector 12 being thus in the form of a plug. It will be understood, of course, that the invention is not limited to this relationship and, for example, the connector 11 might be in the form of a plug which the connector 12 might be in the form of a receptacle. Shells 15 and 16 are preferably of a highly conductive metal such as aluminum and are preferably connected electrically to each other and to electrical grounds of the interconnected circuits.

In accordance with the invention, the connectors 11 an 12 include central plates which are generally designated by reference numerals 17 and 18 and connected to the electrical grounds of interconnected circuits. Plates 17 and 18 together define a central planar ground extending along the length of the connector, in a direction normal to the plane of the paper in FIG. 1. As hereinafter discussed in connection with FIG. 11, each of the plates 17 and 18 may be in the form of a plurality of separate plate sections usable for transmission of DC supply or other voltages but with a low AC impedance between such separate plates, they provide a very low impedance ground connection and act as an electrical separation and shield between contacts on opposite sides thereof. Plate 17 is sandwiched between a pair of members 19 and 20 of insulating material which are secured in the shell 15 of connector 11 and plate 18 is sandwiched between a pair of members 21 and 22 of insulating material which are secured within the shell 16 of connector 12.

In the illustrated embodiment, the connector 11 includes contacts in four groups, contacts 25 of the first group being located relatively close to the ground plate 17 and being supported by the member 19, contacts 26 being spaced further from the ground plate 17 and being also supported by the member 19, contacts 27 being supported by the member 20 ont the opposite side of the ground plate and relatively close to the ground plate 17 and contacts 28 being also supported by the member 20 and being spaced further from the ground plate 17.

As shown in FIG. 2, the contacts 25 and 26 are in staggered relationship to each other and the contacts 27 and 28 are similarly in staggered relation to each other. As also shown in FIG. 2, the shell 11 may have an intermediate wall portion 29, separating the connector into two sections with there being two longitudinally spaced ground plates 11 and associated groups of contacts 25–28. Each of such plates 17 and each of the two mating plates 18 may be in the form of a plurality of separate plate sections, as hereinafter discussed in connection with FIG. 11.

Each connector may have a large number of contacts and, by way of example, each section may have 120 contacts with a total of 240 contacts for the two sections, the spacing of contacts as indicated by reference numeral 30 in FIG. 2 being typically 0.075 inches and the overall length of the connector being on the order of 5 inches. With a contact spacing of 0.05 inches, a total of 352 contacts may be provided. It should be understood, of course, that the connectors need not be separated into two sections as illustrated in FIG. 2 and, of course, any appropriate contact spacing may be used. It is, however, an important feature of the invention that a relatively large number of contacts may be provide in a compact connector with relatively close spacing of contacts, while avoiding the problems which would be encountered with such contact spacings when using prior art constructions.

As shown in FIG. 7, the plug connector 12 has contacts 31, 32, 33 and 34 adapted to mate with the contacts 25, 26, 27 and 28, respectively. Contacts 31 and 32 are supported by the insulating member 21 on one side of the ground plate 18 while contacts 33 and 34 are supported by the insulating member 22 on the opposite side of the insulating member.

All contacts have the same spatial relationship to the associated grounded high conductivity planar ground plate and shell surfaces so that all signal transmission paths have substantially the same characteristic impedance.

As best shown in FIG. 1, each of the contacts 25 has a hollow end portion 25a which projects from a surface 19a of the member 19 and which extends into an opening 21a in the member 21 to receive a projecting portion 31a of the contact 31, indicated in dotted lines. Each of the other contacts of connector 11 has a configuration like that of the contact 25 and each of the other contacts of connector 12 has a configuration like that of the contact 31. Thus in the illustrated arrangement, each contact 25 is a female contact and each contact 31 is a male contact but it will be understood that the contacts may be reversed and that, in any case, the invention is not limited to any particular form or relationship of the mating signal contacts.

The construction of the ground plate 17 is illustrated in FIG. 5. It is preferably of a copper alloy which may be approximately 0.006 inches thick with a 0.00005 inch gold plate for maximum conductivity and it is formed with projecting fingers or tines 17a and 17b as shown, having terminal end portions 17c and 17d bent in opposite directions from a central plane of the plate 17 and having portions 17e and 17f for pressure engagement with an edge portion of the plate 18 when the connectors are assembled. The relationship of the tines 17a and 17b before assembly is illustrated in FIG. 4. In assembly, the tines 17a and 17b move into recesses 22b and 21b, respectively, of the insulating members 21 and 21. In the normal mating sequence, the end of the shell 16 moves into the shell 15, then the edge of the plate 18 moves between the terminal ends 17c and 174 of the tines 17a and 17b and then the ends of the contacts 31–34 move into the sockets defined by the hollow ends of the contacts 25–28. With this mating sequence, the ground connection is made before the signal connection and any electrostatic build-up is discharged before engagement of signal contacts. This protects electronic devices from damage during handling and repair.

The construction of the plate 18 is shown in FIGS. 1 and 8. It is preferably of a copper alloy which may be approximately 0.006 inches thick, with a 0.00005 inch gold plate for increased conductivity and, for connection to the circuit board assembly, it has one edge rolled to form an open generally tubular portion 18a. The portion 18a engages ground terminals which extend in facing relation on the surfaces 37 and 38 of two circuit boards 39 and 40 which form the circuit board assembly 14. In the illustrated arrangement, a thick metal plate 41 is disposed between the circuit boards 39 and 40 to form a heat sink. The circuit boards 39 and 40 are so formed as to provide terminals which engage extensions 31a, 32a, 33a and 34a and also the portion 18a of ground plate 18 may be tinned before assembly and soldered to the respective terminals after assembly, or other bonding operations may be performed, if desired.

FIG. 9 illustrates a modified ground plate 42 usable in place of the ground plate 18 and having a plurality of fingers or tines along its length, alternate tines 42a being bend outwardly in one direction and the remaining tines being bent outwardly in the opposite direction, for engagement with ground terminals of the printed circuit boards 39 and 40.

FIG. 10 shows a modified ground plate 44 which has tines 44a and 44b formed to engage ground terminals 45 and 46 on the outside surfaces of the printed wiring boards 39 and 40 of assembly 14.

Figure 11:
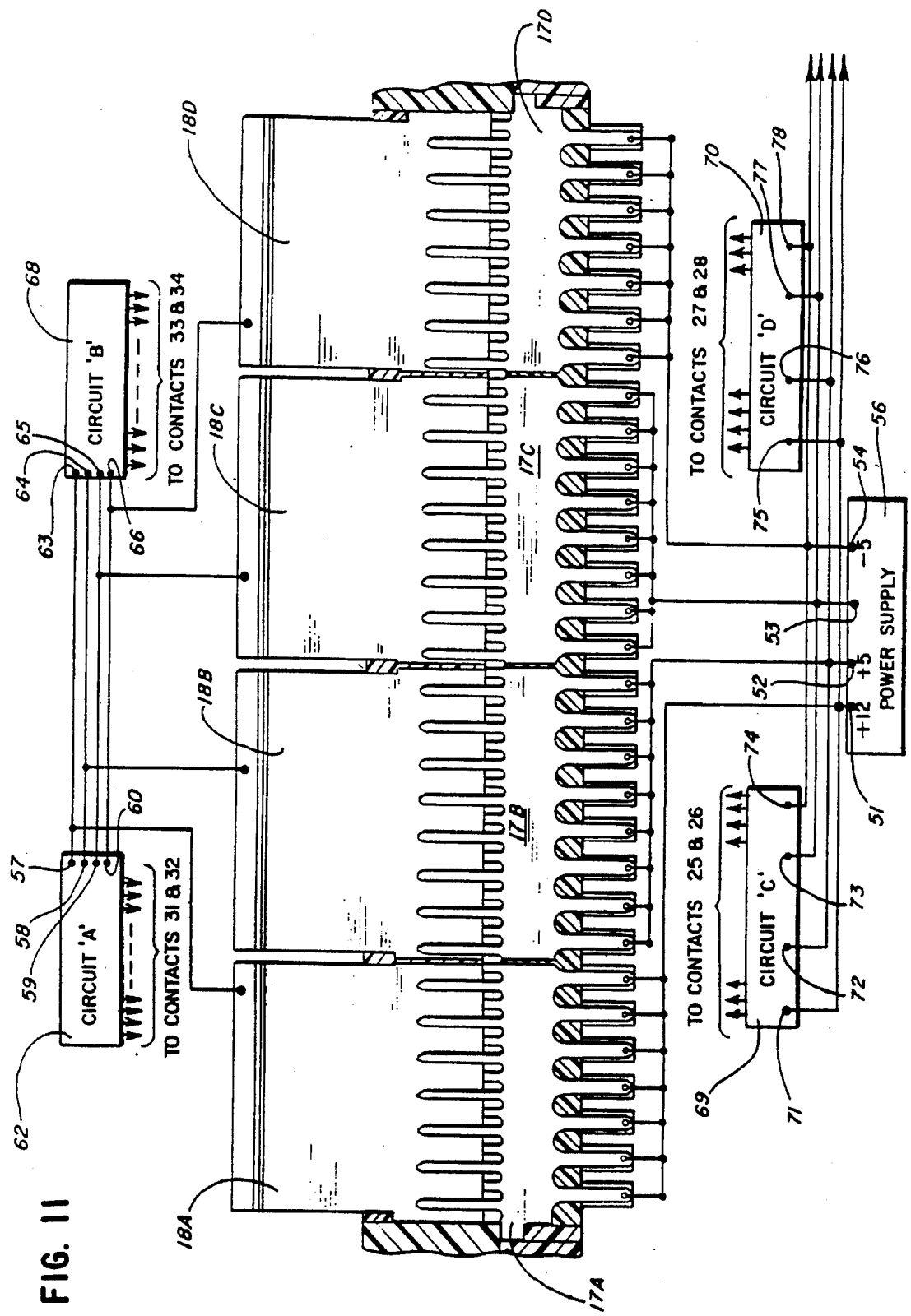
FIG. 11 is a cross sectional view taken substantially along line XI—XI of FIG. 1.

As shown in FIG. 11, the ground plate 17 of one section of the illustrated connector 11 is formed by four separate plate sections 17A, 17B, 17C and 17D which are in longitudinally spaced relation but with close spacings therebetween, preferably less that the distance between contacts. The ground plate 18 of the corresponding section of the connector 12 is formed by four separate plate sections 18A, 18B, 18C and 18C also in longitudinally spaced relation but with close spacings therebetween. The AC impedances between the plate sections 17A–17D and between the plate sections 18A–a8C is desirably very low so that at high frequencies, plate sections 17A–17D and plate sections 18A–18C effectively form one ground plate when connected. However, they are usable advantageously for transmission of supply, reference or control voltages.

For example, as diagrammatically illustrated in FIG. 11, plate sections 17A, 17,B, 17C and 17D of the mother board connector 11 may be respectively connected to +12 volt, +5 volt, common and –5 volt terminals 51, 52, 53 and 54 of a DC power supply 56 and plate sections 18A, 18B, 18C and 18D of the daughter board connector 12 may be respectively connected to power input terminals 57–60 of an "A" circuit 62 of the daughter board and power input terminals 63–66 of a "B" circuit 68 of the daughter board, the "A" and "B" circuits being on the circuit boards 39 and 40 of the illustrated embodiment and being connected to the signal contacts 31 and 32 on one side of the central ground plane and signal contacts 33 and 34 on the opposite side of the ground plane. As also shown, signal contacts 25 and 26 and signal contacts 27 and 28 of the mother board connector 11 may be connected to "C" and "D" signal circuits 69 and 70, respectively, circuits 69 and 70 having terminals 71–74 and terminals 75–78 connected to terminals 51–54 of power supply 56. It will be understood that the power supply 56 will provide low high frequency impedances to signal ground at terminals 51–54 and also that the "A" and "B" circuits 62 and 68 may include capacitors providing low high frequency impedances between signal ground and terminals 57–60 and 63–66.

The plates of the second connector sections, on the other side of the intermediate wall portion 29, may be divided into separate plate sections like sections 17A–17D and 18A–18D, but it is noted that in some applications, two ground plates or two ground plates and a shell, as provided in an embodiment disclosed in the aforementioned prior application U.S. Ser. No. 876,179, issued as U.S. Pat. No. 4,710,833 on Dec. 1, 1987, may be all that is needed for voltage transmission.

It will be understood that the invention is not limited to use of ground plates as described above for transmission of DC supply voltages but such ground plates may be used for transmission of DC reference voltages and on-off control voltages. They may also be used for transmission of low frequency AC power supply, reference or control voltages and as many plates or plate sections may be provided as are desired or required for any particular application. Thus it is not necessary to use contacts for such purposes and all contacts are available for use in propagating high frequency signals. Moreover, uniform impedance characteristics are obtained between all contacts and the ground provided by the ground plates and the outer shell.

Figure 12:
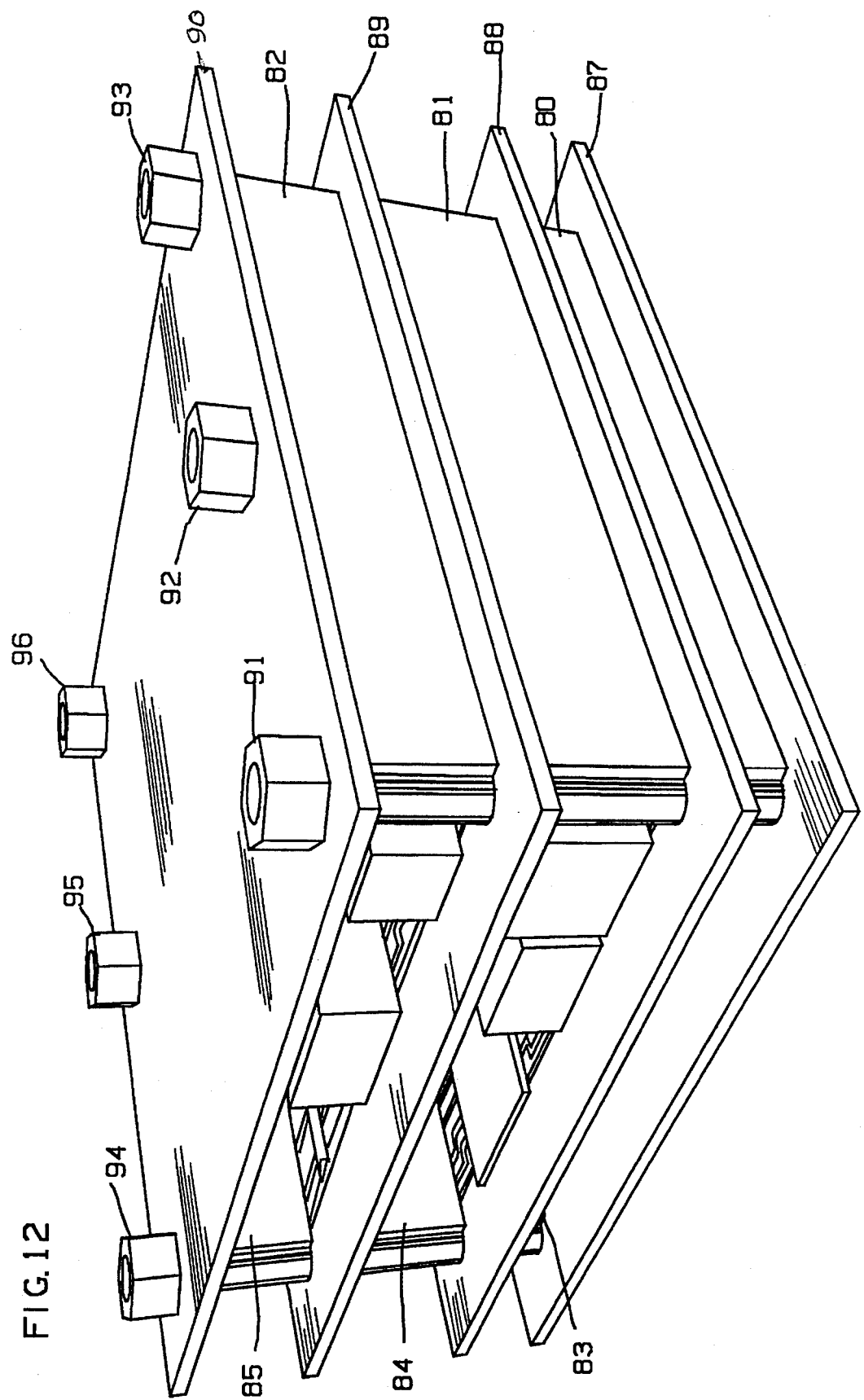
FIG. 12 is a perspective view showing electrical connectors of the invention installed in a circuit board assembly.

FIG. 12 shows six connectors 80–85 which are constructed in accordance with the principles of the invention and which are shown mounted in a circuit board assembly 86. The assembly 86 includes four circuit boards 87, 88, 89 and 90 which are mounted in a stack and which are secured together by six bolts 91–96.

The connectors 80–85 function to interconnect circuits on the boards 87–90 and also function as spacers between the boards, being installed in three pairs between edge portions of the boards, as shown. The connectors of the invention are advantageous in providing short length signal propagation paths between the boards which are shielded and isolated as required and which are of uniform impedance and otherwise highly efficient. In addition, the connectors serve to couple DC and low frequency AC voltages between the circuit boards, and a very compact assembly is achieved. As is also shown, the vertical dimensions of three pairs of connectors are different, being selected in accordance with the vertical extent of components on the boards 81–84. As illustrated, the connectors 80 and 83 have relatively small vertical dimensions while the connectors 81 and 84 and connectors 82 and 85 have larger vertical dimensions.

Figures 13, 14:
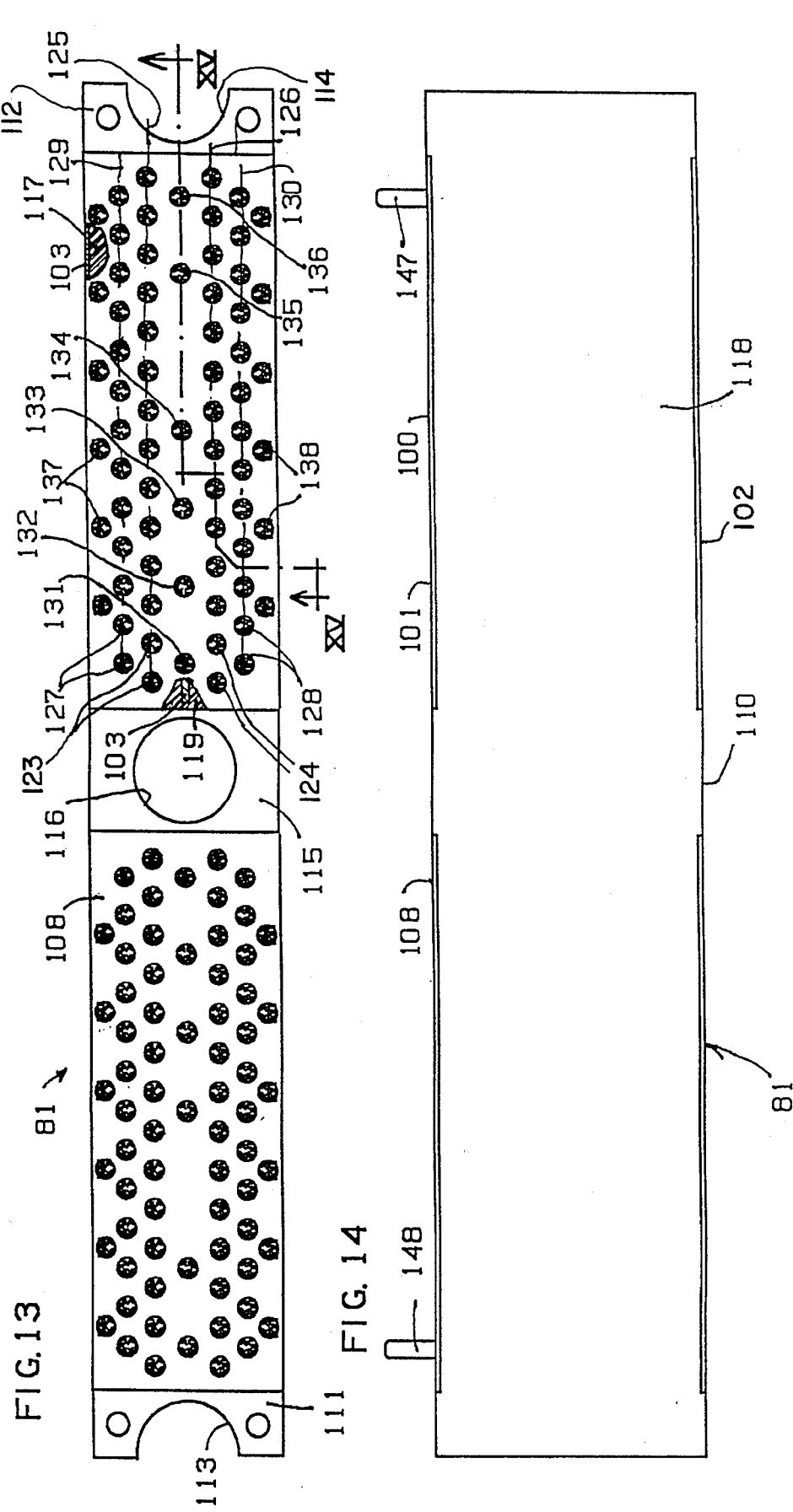
FIG. 13 is a top plan view of one of the connectors of FIG. 12.
FIG. 14 is a front elevational view of the connector of FIG. 13.
Figure 15:
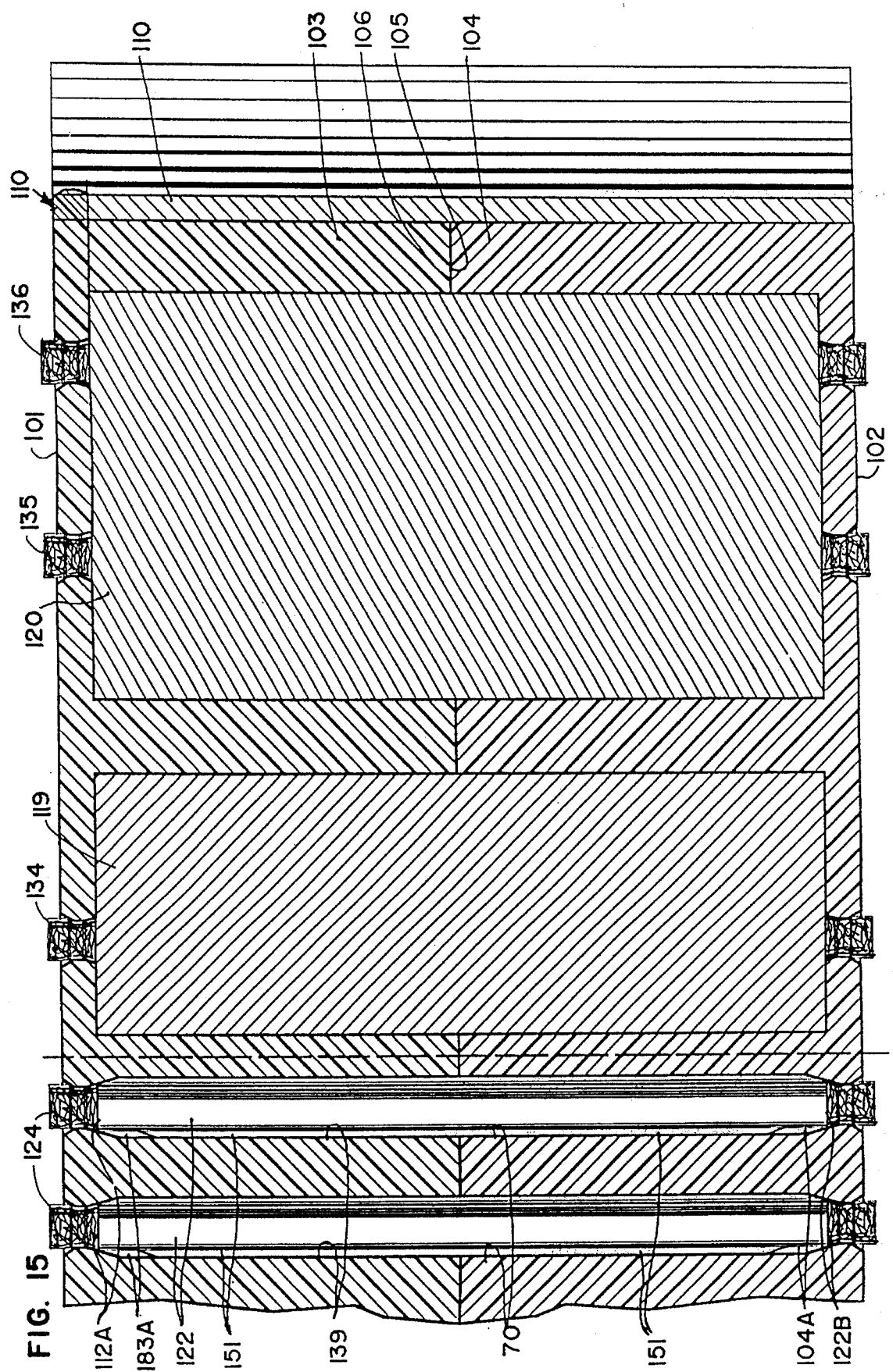
FIG. 15 is a sectional view taken substantially along line XV—XV of FIG. 13.
Figure 16:
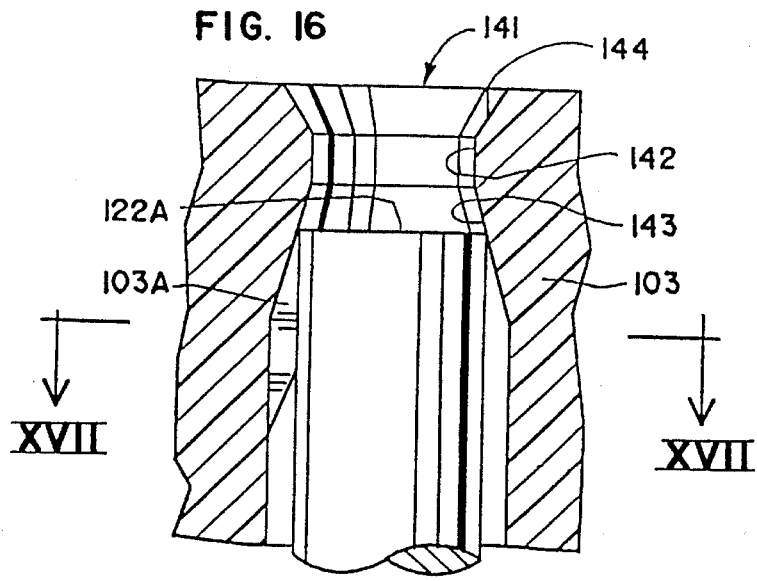
FIG. 16 is a cross-sectional view of a portion of the connector of FIG. 13 on an enlarged scale, showing details of a button-receiving cavity of an insulator member of the connector.

FIGS. 13 and 14 are respectively top plan and side elevational view of the connector 81, and FIG. 15 is a sectional view taken substantially along line XV—XV of FIG. 13. It will be understood that the constructions of the other connectors 80 and 82–85 may be like that of the connector 81, except that the connectors 80, 82, 83 and 85 may have different vertical dimensions. The connector 81 includes a block 100 which is of insulating material and which has upper and lower planar surfaces 101 and 102. Block 100 is preferably formed by upper and lower members 103 and 104 respectively having lower and upper surfaces 105 and 106 engaging in a plane which is midway between the surfaces 101 and 102 in the illustrated connector but which may be positioned at unequal distances from the surfaces 101 and 102.

In the illustrated connector 81, a second block 108 of insulating material is provided which is substantially the same as the block 100 and which is also formed by two members like the members 103 and 104 which form the block 100. The two blocks 100 and 108 are mounted within a casing 110 of conductive material which includes end portions 111 and 112 formed with guide slots 113 and 114 to receive shank portions of bolts 91 and 93 and a central portion 115 which is between blocks 100 and 108 and which has a hole 116 therethrough to receive the shank portion of bolt 92. The casing 110 also includes side walls 117 and 118, the wall 118 being shown in the side elevational view of FIG. 14 and a portion of the upper block member being shown broken away in FIG. 13 to show a portion of the opposite side wall 117.

Important features relate to the provision of a central ground plane which is formed in part by plates 119 and 120 of conductive material in block 100 as shown in FIG. 15. Only a portion of plate 119 is shown in FIG. 15 since FIG. 15 is an offset sectional view. A portion of the block member 103 is shown broken away in FIG. 14, to show that the plate 119 extends to an end edge in proximity to the inner end of block 100 and to the central portion 115 of the casing 110. Similar plates are provided in the block 108 to define a central ground plane thereof. The plates 119 and 120 are insulated from the casing 110 but the plates 119 and 120 as well as the casing 110 are connectable directly or through by-pass capacitors to ground conductors of the circuit boards 88 and 89, so as to be at ground potential with respect to propagation of high frequency signals. Plates 119 and 120 and corresponding plates within the block 108 thus provide a substantially continuous ground plane. At the same time, since the plates 119 and 120 are electrically insulated from one another and from the casing 110 they may be used with the casing for conducting DC and low frequency AC voltages between the circuit boards 88 and 89.

A plurality of elongated conductive slugs 122 are provided within the blocks 100 and 108 for propagation of signals between the circuit boards 88 and 89, two of such slugs 122 being shown in FIG. 15. To connect upper and lower ends of such slugs to conductors of the circuit boards 88 and 89, compressible conductive buttons are provided. In the illustrated construction, such conductive buttons include two rows of buttons 123 and 124 at the upper ends of two rows of slugs in a first pair planes which are indicated by broken lines 125 and 126 and which are on opposite sides of the central ground plane defined by plates 119 and 120. Two additional rows of button's 127 and 128 are provided at the upper ends of an additional two rows of slugs which are in a second pair of planes which are indicated by broken lines 129 and 130 and which on opposite sides of the central ground plane and between the first pair of planes 125 and 126 and the opposite side walls 117 and 118 of the casing 110.

A row of conductive buttons is also provided to connect upper edges of the plates 119 and 120 to conductors on the circuit board 88, including four buttons 131–134 engaged with the upper edge of plate 119 and two buttons 135 and 136 engaged with the upper edge of plate 120. Additional rows of conductive buttons 137 and 138 are engaged with upper edges of the side walls 117 and 118 of the casing 110.

Important features relate to the achievement of a uniform characteristic impedance for all signal propagation paths through the conductive slugs of the connector. In the illustrated construction the distance from the slugs of the first pair of planes 125 and 126 to the plates 119 and 120 is substantially equal to the distance from the slugs of the second pair of planes 129 and 130 to the side walls of the casing 110. It follows that the distance from the slugs of the first pair of planes 125 and 126 to the side walls 117 and 118 of the casing is equal to the spacing from the slugs of the second pair of planes 129 and 130 to the plates. Thus the relationship of each slug to planar surfaces of conductive material which are usable to provide circuit grounds is the same as that of each of the other slugs. In addition, the slugs are mounted in a uniform manner and with a uniform spacing from each slug to slugs adjacent thereto. The result is that uniform characteristic impedances are obtained. Preferably, the slugs in the first pair of planes 125 and 126 are in staggered relation to those of the second pair of planes 129 and 130, so as minimize the width of the connector while obtaining a uniform and desired spacing between each slug and slugs adjacent thereto.

The conductive buttons 123, 124, 127 and 128, 131–136, 137 and 138 are mounted in cavities in the upper surface 101 of the upper member 103 of block 100 for engagement with the conductive pads on the underside of the circuit board 89 and corresponding series of conductive buttons are mounted in cavities in the lower surface 102 of the lower member 104 of block 100 for engagement with the conductive pads on the upper side of the circuit board 88. Each of the buttons may typically be in the form of an elongated cylindrical contact element comprising a resiliently and randomly wadded thin gauge electrically conductive wire. Such buttons provide low impedance connections when proper contact pressures are maintained between such buttons and contact surfaces engaged thereby.

Two of the slugs 122 are shown in the offset sectional view of FIG. 15, having upper ends in the plane 126 and engaged with two of the buttons 124. Each slug 122 is positioned in an opening in the block 100 which is defined by aligned openings 139 and 140 in the upper and lower members 103 and 104, each slug being so positioned that terminal upper and lower end surfaces thereof are respectively spaced at substantially equal distances below and above the upper and lower surfaces 101 and 102 of the block 100 to provide cavities which receive one of the buttons 124 and a corresponding button 124A at the lower face of the connector. Only a cavity 141 at the upper end of one of the illustrated slugs 122 will be described in detail, the cavity at the lower end and other cavities of the connector being of substantially the same form.

The cavity 141 in the upper member 103 has an "hour glass" shape and is defined by surface portions which include an intermediate neck portion 142, an inner flared portion 143 and an outer flared portion 144. The remainder of the opening 139 in the upper member 103 is defined by a right cylindrical surface portion 146 which extends downwardly from the lower end of the inner flared portion 143 to the lower surface of the member 103.

The neck portion 142 has a very small axial dimension and applies a localized compressive pressure to the button 124 when installed to securely hold the button 124 in place while allowing free resilient axial compression of the button 124 to obtain reliable low resistance connections. The inner flared portion 143 provides an expansion region into which a lower portion of the button expands when the button is installed, to additionally insure the secured holding of the button in place while allowing free resilient axial compression thereof. The outer flared portion 144 facilitates installation of the button and avoids entrapment of any protruding fine wire portions of the button between facing surfaces of the connector and circuit board. It also facilitates the free axial compression of the button when installed and accommodates any slight transverse relative shifting movements of the connector and circuit board as may occur during or after assembly. It preferably is of very smooth form, facilitating installation of the buttons and avoiding sharp edges which might catch and cause entrapment of protruding wire portions of the buttons.

Figure 17:
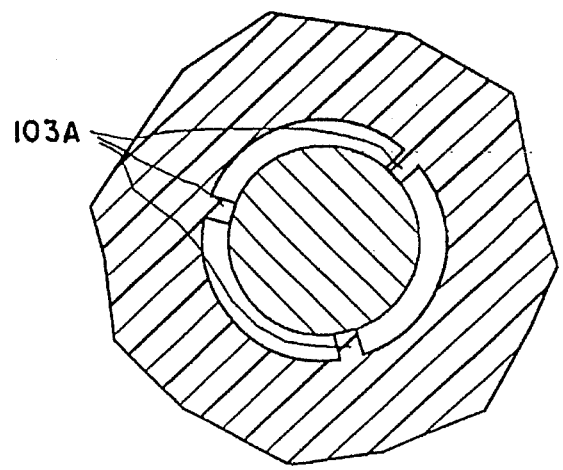
FIG. 17 is a cross-sectional view taken substantially along line XVII—XVII of FIG. 16.

In assembling the connector, the members 103 and 104 are moved together while positioning the plates 119 and 120 to enter openings in the block members 103 and 104 and while positioning the slugs 122 to enter the openings of the members 103 and 104 at the interengageable lower and upper surfaces 105 and 106 thereof, so that the slugs 122 do not pass through the cavity-defining surfaces. The plates 119 and 120 and the slugs 122 may preferably be installed with a press fit using fixtures to obtain accurate positioning thereof. Terminal end portions of the slugs 122 are engaged by sets of protrusions 103A and 104A which are formed as integral parts of the block members 103 and 104 and which extend radially inwardly into localized pressure engagement with the slugs 122. FIG. 17 shows three protrusions 103A in 120 degree arcuately spaced relation and forming one set and each other set of protrusions may be formed in a similar manner. The protrusions 103A and 104A hold the slugs in centered relation in the openings 139 and 140 and provide for air gaps along the length of the slugs and for impedance control in accordance with important features of the invention as hereinafter described. Other equivalent means may be used to hold the slugs in centered relation and to provide air gaps along the length of the slugs. For example, collars may be provided on the slugs 122, either as separate members or as integral parts of the slugs 122, as shown for example in the aforesaid prior application Ser. No. 07/375,588.

When the slug 122 is installed as shown in FIGS. 14 and 15, its upper terminal end surface, indicated by reference numeral 122A, is positioned below the lower end of the neck portion 142 and its opposite terminal end surface 122B is similarly positioned with respect to the corresponding surface of a cavity at the lower side of the connector, thereby providing the aforementioned expansion regions. The block members 103 and 104 may be secured together by any suitable means, such as through the use of an adhesive at the interengaging surfaces 105 and 106.

After assembly of the block members 103 and 104 and the slugs 122, the buttons 123, 124, 127 and 128, 131–136, 137 and 138 are installed in the respective cavities which are provided above the slugs 122, the plates 119 and 120 and above upper edge portions of side walls of the casing 110. In its initial nominal or unstressed condition, each button may be of generally right cylindrical shape with a diameter substantially less than that of the outer flared portion 144 and only slightly greater than that of the neck portion 142, sufficient to securely hold the button in place while allowing free axial compression thereof to obtain electrically efficient contact pressures.

To facilitate assembly of the connector 81 with circuit boards, a pair of alignment pins 147 and 148 are press fitted into holes in the block 100 to project upwardly from block 100 and from block 108 and to extend into alignment holes of circuit board 88. The pins 147 and 148 may extend through the circuit board 88 and into alignment holes of blocks of the next higher connector 82. Similar pins may be installed to project from the opposite lower face of a connector, if desired. After assembly of all connectors in the assembly of FIG. 12 the nuts of the bolts 91–96 are tightened to compress all conductive buttons of the connectors 80–85 into pressure engagement with conductive pads of the circuit boards 87–90 and to obtain stable and reliable electrical contact therewith.

Figure 18:
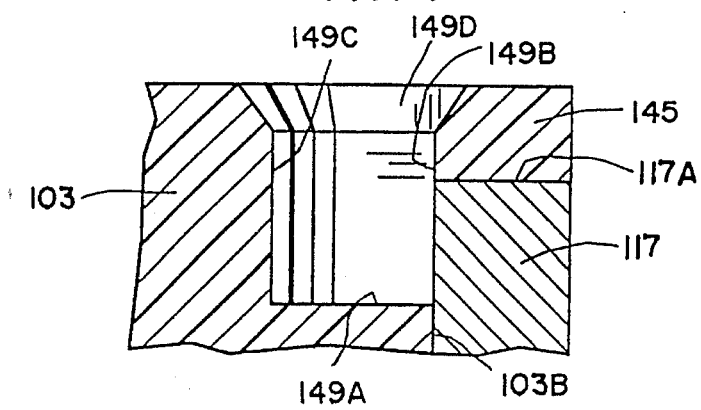
FIG. 18 is a cross-sectional view similar to FIG. 16, but showing details of a button-receiving cavity of an insulator member and its relationship to an upper edge portion of the side wall of a casing.

As is shown in FIG. 18, a modified type of cavity is provided for receiving the buttons 137 and 138 which engage the upper edges of casing side walls. The upper block member 103 has a pair outwardly protruding lip portions at its upper end which extend over upper terminal edges of casing side walls, one of such protruding lip portions 145 being disposed over the upper edge 117A of the casing side wall 117 as shown in FIG. 18. A cavity adjacent thereto includes a bottom surface 149A which is below the upper edge 117A of the casing side wall 117, a surface 149B which is aligned with a side surface 103B of the upper block member 103, a surface 149C which is partly of cylindrical form, an upper portion thereof extending to ends of the surface 149B, and an outer surface 149D of beveled form. When a button is pressed into the cavity formed by the surfaces 149A, 149B, 149C and 149D, a lower portion of the button is resiliently compressed in a side-wise direction into firm engagement with an upper inside surface portion of the casing side wall 117.

Further important features of the invention relate to the control of characteristic impedances in the signal propagation paths through the connector 81. In using the connector, the upper and lower end edges of the casing side walls 117 and 118 and the upper and lower end edges of the plates 119 and 120 are connected through conductive buttons to circuit board pads which are connected directly or through by-pass capacitors to ground, the casing side walls and the plates 119 and 120 thereby defining ground planes for the purpose of propagation of high frequency signals. Each of the slugs 122 is disposed between a pair of such ground planes and cooperates therewith to define a propagation path which has a substantially uniform cross-sectional configuration along its length and which thereby has a uniform characteristic impedance. A uniform characteristic impedance is highly desirable for the reason that undesirable reflections of energy, the development of standing waves, and attenuation of signals along the length of the paths are avoided. It is also found to be highly desirable that the characteristic impedances of the signal paths provided by the slugs be matched to characteristic impedances which are provided at the conductive pads of the interconnected circuit boards, circuit components on the boards and traces on the boards interconnecting such traces to the conductive pads. It is possible for the circuit board designer to so design a board as to obtain desired characteristic impedances at pads at which the efficient and reliable propagation of high frequency signals is critical. For this reason, it is found to be desirable that the characteristic impedance of each slug of the connector be known. Design is particularly facilitated by providing all slugs with the same characteristic impedance.

The characteristic impedance of a transmission line having uniform characteristics along its length is equal to the square root of the ratio of the series impedance per unit length to shunt admittance per unit length. At higher frequencies, the resistive terms of the series impedance and shunt admittance expressions are quite small and the characteristic impedance can be assumed for practical purposes to be equal to the square root of the ratio of the inductance per unit length to the capacitance per unit length. The inductance per unit length of a round conductor in parallel relation to ground planes is a function of its diameter and its spatial relationship to such ground planes. The capacitance per unit length of a conductor in parallel relation to ground planes is a function of the dielectric constant of the medium between the conductor and the ground planes. The spacing between adjacent slugs in the illustrated embodiment is 0.1 inches, the other dimensions being in the same proportions as illustrated in the drawings.

Although not by itself a feature of the present invention, it is noted that in the illustrated construction, an air space as indicated by reference numeral 151 is provided between outside surfaces of each slug 122 and the internal surfaces which are provided by the openings 139 and 140 in the block members 103 and 104. To permit assembly of the block members 103 and 104 in the casing 110 and assembly of plates 119 and 120 in the block members the relative dimensions are such that there are also air spaces between inside surfaces of the side walls 117 and 118 of casing 110 and the block members 103 and 104 of insulating material as well as between the surfaces of the plates 119 and 120 and the block members 103 and 104. The effect is to provide three capacitances in series relation each other and in shunt relation to the propagation path, one being that provided by the air space 151, another capacitance being provided by the dielectric material of the block members 103 and 104 and a third capacitance being provided by air spaces between the block members 103 and 104 and the casing side walls 117 and 118 and the plates 119 and 120. The dielectric constant of air is essentially unity while the dielectric constant of the block members is substantially higher. By controlling the dimensions of air spaces along the slugs 122, any desired characteristic impedance within a wide range may be obtained with any dielectric material having a given dielectric constant. In addition, by using the same dimensions for the air spaces for all slugs and by using the same relationships of all slugs to the adjacent ground planes as aforementioned, all slugs may provide paths of the same characteristic impedance to facilitate design of circuit boards to be interconnected.

In the illustrated construction, the slugs are of cylindrical shape and the protrusions 103A and 104A serve to accurately position each slug 122 in centered relation but any equivalent shape and locating means may be employed.

It will be understood that modifications and variations may be made. For example, in some applications, central ground plates such as plates 119 and 120 may not be required one or more rows of conductive slugs may be mounted between a pair of opposite side walls of a connector which may be grounded. Other modifications and variations may be effected without departing from the spirit and scope of the novel concepts of the invention.

Figure 19:
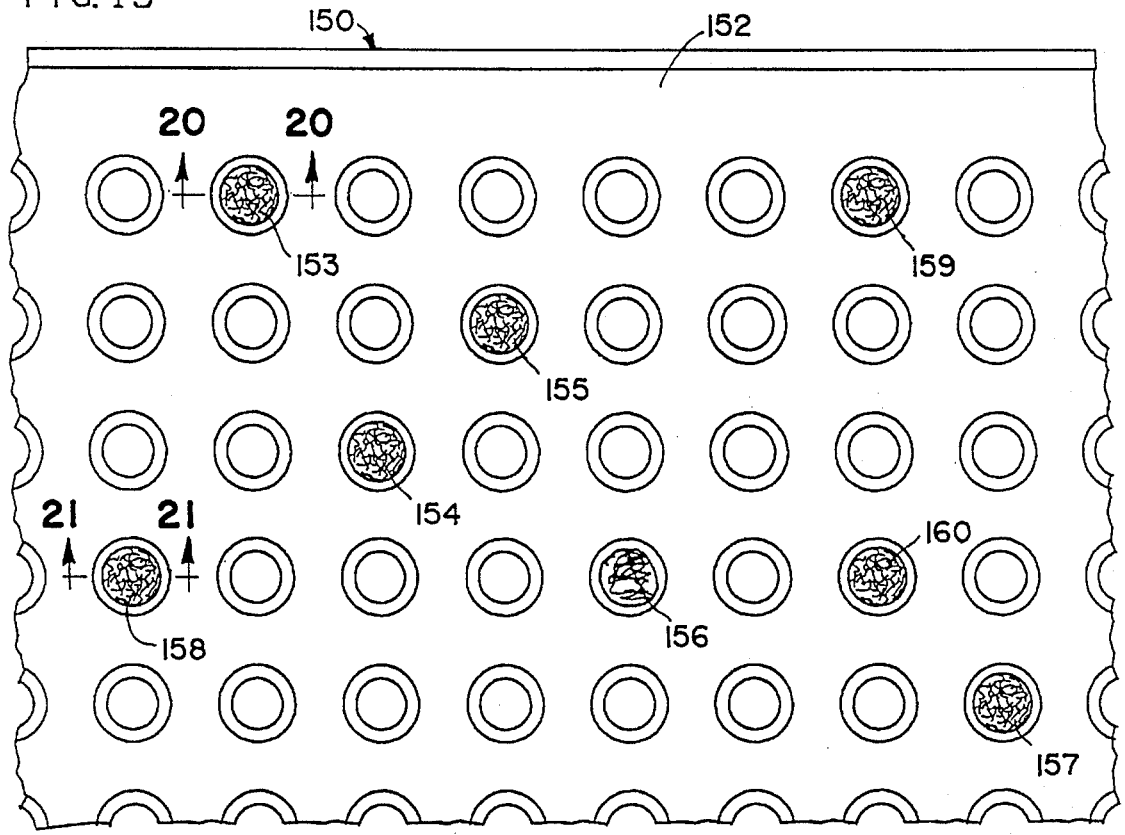
FIG. 19 is a top plan view of a portion of a another form of connector of the invention, arranged to be placed between circuit boards and incorporating signal propagating and grounding interconnect devices.

FIG. 19 is a top plan view of a portion of another type of connector 150 which is constructed in accordance with the principles of the invention. The connector 150 comprises plate 152 which supports interconnect devices for propagation of signals between a pair of circuit boards while having a ground structure which provides a grounded conductor in adjacent relation to each signal propagating device. The illustrated portion of the plate 152 is arranged to be sandwiched between opposed portions of a pair of circuit boards and has a large number of openings therethrough with conductive interconnect devices installed in selected openings of the plate for engagement of opposite ends of the devices with conductive pads on the opposed surfaces of the circuit board. By providing a large number of openings, the circuit designer has great flexibility with respect to design of circuit boards and the positioning of conductive pads thereon.

To illustrate features of the invention, eight interconnect devices 153–160 are shown installed in certain openings of the plate 152, at positions which might be selected by a user in accordance with the positioning of pads of the circuit boards to be connected. Of these, devices 153–157 are insulated from the ground structure of the plate 152 to be usable for signal propagation, while devices 158–160 are used for effecting ground connections to spaced locations of the grounding structure of the plate.

Figure 20:
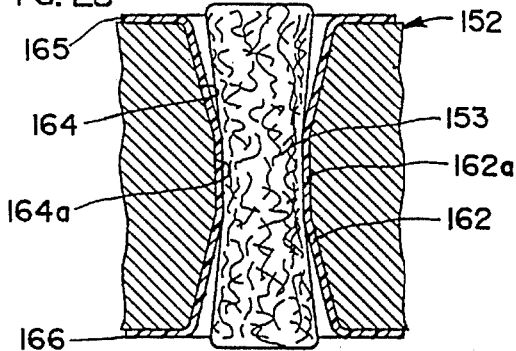
FIG. 20 is a cross-sectional view taken substantially along line 20—20 of FIG. 19 and illustrating one form of connector construction and a signal propagating interconnect device thereof.

FIG. 20 is a cross-sectional view illustrating the construction of the plate 152 and the mounting of the device 153 which is one of the illustrated devices usable for signal propagation. As shown, the device 153 is in the form of a wadded conductor contact or button of the type including a "wad" of fine wire which is resiliently compressible between the surfaces of conductive pads of circuit boards to be connected. Device 153 is mounted within an annulus 162 of an insulating dielectric material on the inside of an opening 164 in the plate 152 which is of a conductive material such as aluminum, for example, and which is grounded to thereby provide a ground conductor completely surrounding the interconnect device 153.

Layers 165 and 166 of an insulating dielectric material are provided on the opposite surfaces of the conductive plate 152 for the purpose of preventing direct electrical contact between the surfaces of the plate and conductive traces of the interconnected circuit boards.

The internal surface of the annulus 162 preferably has a narrowed neck portion, indicated by reference numeral 162a, operative to securely hold the device 153 in place while permitting transverse expansion of end portions of the device 153 in response to axially applied compressive forces. In the construction as shown in FIG. 20, both the annulus 162 and the layers 165 and 166 are formed by a coating of teflon or other plastic material. The illustrated coating is of uniform thickness and the opening 164 has a narrowed neck portion 164a around the narrowed neck portion 162a of the annulus 162. However, it will be understood that the opening 164 may be of uniform diameter and the coating itself may be thickened to provide a narrowed neck portion. Anodization of an aluminum plate, or other similar processes may be used for forming layers of insulating material, especially on the opposite surfaces of the plate 152, to provide additional protection or as the only protection against contact with circuit board traces.

Figure 21:
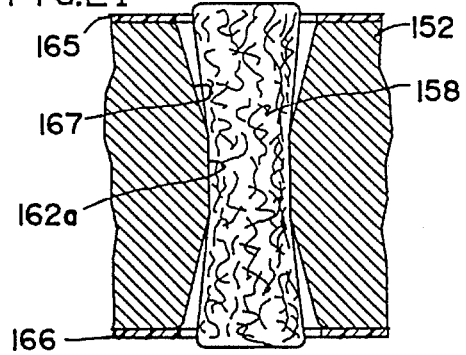
FIG. 21 is a cross-sectional view taken substantially along line 21—21 of FIG. 19 and is similar to FIG. 20 but illustrates a grounding interconnect device of one form of connector.

FIG. 21 shows the mounting of the device 158 which is one of the illustrated devices used to effect ground connections to the plate 152. In this case, the device 158 is mounted in an opening 167 which is like the opening 164 and which has a narrowed neck portion 167a but which is not covered by a plastic material to provide a bare metal surface in direct engagement with the outer surface of the device 158.

Figure 22:
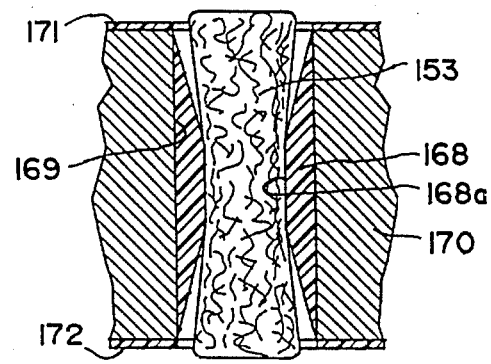
FIG. 22 is a cross-sectional view similar to FIG. 20 but illustrating another form of connector construction and a signal propagating interconnect device thereof.

An alternative construction of a mounting for use in signal propagation is shown in FIG. 22. An annulus 168 is provided which is in the form of a plastic insert installed in an opening 169 in a conductive plate 170 having layers 171 and 172 of insulating material on its opposite surfaces. In this construction, the opening 169 may have a uniform diameter and the insert 168 may have a inner surface configured to provide a narrowed neck portion 168a. In the arrangement of FIG. 21, the thickness of the wall of the annulus 168 may be selected to obtain, within limits, a certain capacitance between the device 153 and the adjacent surface of the grounded conductive plate 168 which is such as to obtain a desired characteristic impedance. Also, inserts such as insert 168 need be provided only in those openings in which devices are to be installed.

Figure 23:
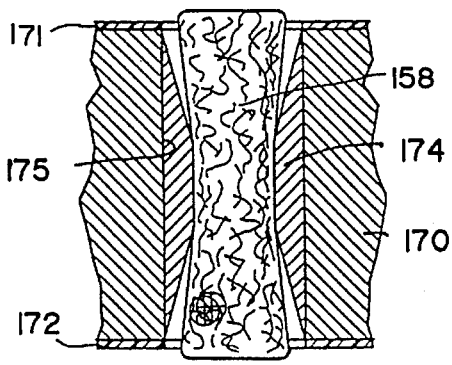
FIG. 23 is a cross-sectional view similar to FIG. 21 but illustrates a grounding interconnect device of another form of connector.

An alternative of a construction for use in grounding is shown in FIG. 23. In this construction, an annular insert 174 is installed in an opening 175 of the plate 170, insert 174 being of conductive material and having the same shape as the insert 168 of FIG. 22. When used in conjunction with the arrangement of FIG. 22, all openings in the plate 170 may have the same size and configuration.

Figure 24:
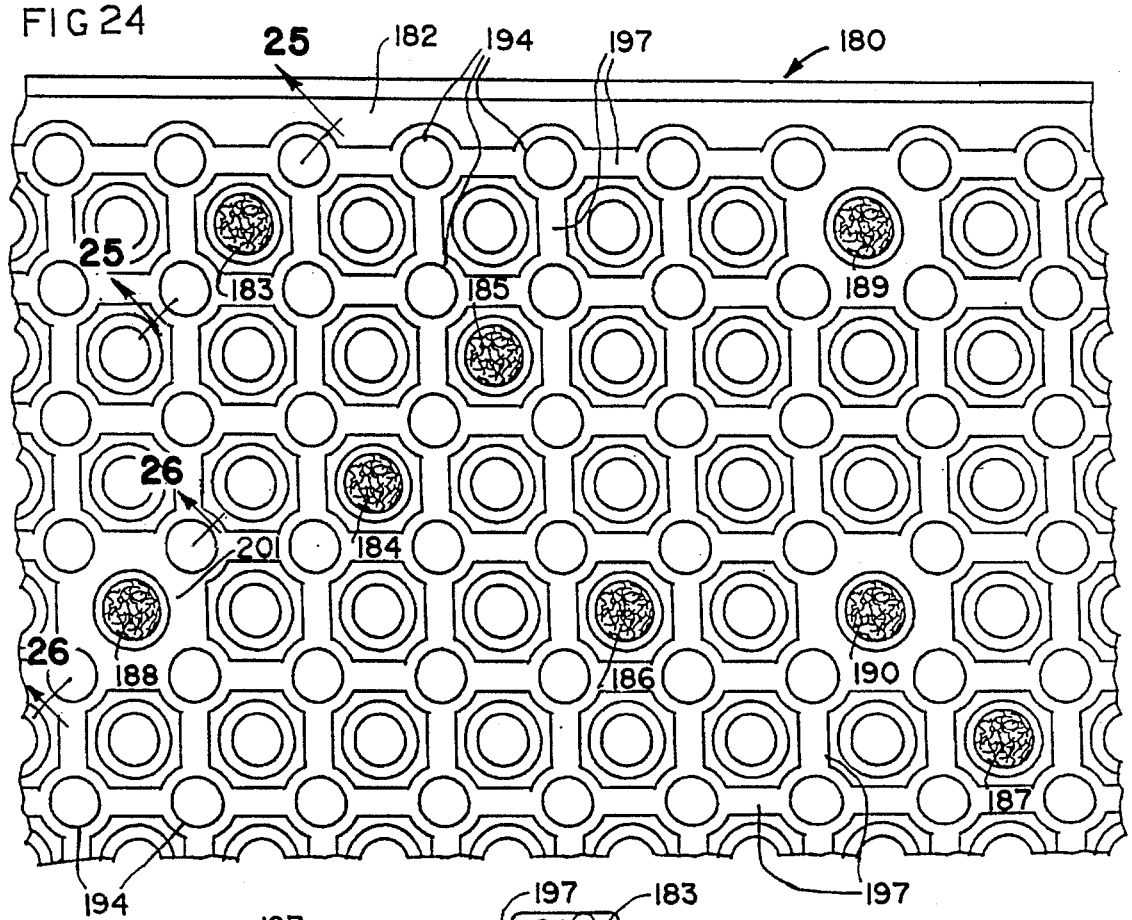
FIG. 24 is a top plan view of a portion of a further form of connector of the invention, similar to FIG. 19, the connector being arranged to be placed between circuit boards and incorporating signal propagating and grounding interconnect devices.

FIG. 24 is a top plan view similar to FIG. 19 but illustrating a portion of another type of connector 180 which is constructed in accordance with the principles of the invention. The connector 180 comprises a plate 182 which supports interconnect devices for propagation of signals between a pair of circuit boards while having a ground structure which provides a grounded conductor in adjacent relation to each signal propagating device. In the connector 180, the plate 182 is of insulating material and carries conductive material to form the ground structure. As was described in connection with the plate 152, the illustrated portion of the plate 182 is arranged to be sandwiched between opposed portions of a pair of circuit boards and has a large number of openings therethrough with conductive interconnect devices installed in selected openings of the plate for engagement of opposite ends of the devices with conductive pads on the opposed surfaces of the circuit board. By providing a large number of openings, the circuit designer has great flexibility with respect to design of circuit boards and the positioning of conductive pads thereon.

To illustrate features of the invention, eight interconnect devices 183–190 are shown installed in certain openings of the plate 182, at positions which might be selected by a user in accordance with the positioning of pads of the circuit boards to be connected. Of these, devices 183–187 are insulated from the ground structure of the plate 182 to be usable for signal propagation, while devices 188–190 are used for effecting ground connections to spaced locations of the grounding structure of the plate.

Figure 25:
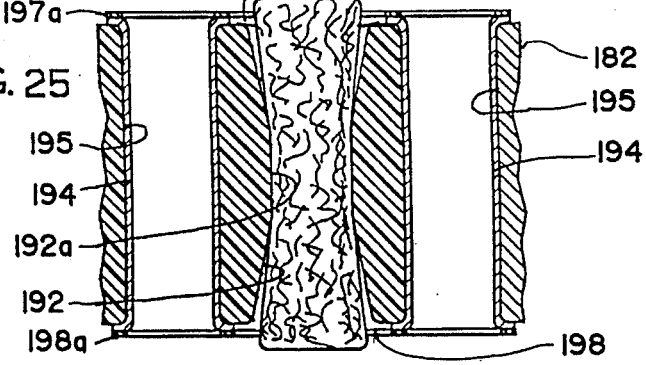
FIG. 25 is a cross-sectional view taken substantially along line 25—25 of FIG. 24 and illustrating the construction of the connector and a signal propagating interconnect device thereof.

FIG. 25 is a cross-sectional view illustrating the construction of the plate 182 and the mounting of the device 183 which is one of the illustrated interconnect devices usable for signal propagation. Device 183, which is shown as being in the form of a wadded conductor contact or button is mounted within an opening 192 of the plate 182 which is of an insulating dielectric material, the opening 192 preferably having a narrowed neck portion 192a as shown.

A ground structure is provided which includes conductors 194 which are in adjacent relation to the interconnect devices and which preferably extend through openings 195 in the plate 182 in parallel relation to the interconnect devices. In the illustrated arrangement, a matrix of the conductors 194 is provided with there being four of the conductors 194 in surrounding relation to each interconnect device-receiving opening. Ends of the conductors 194 are interconnected by a web of conductors 197 on the side of the plate 182 shown in FIG. 24 and opposite ends of the conductors 194 are interconnected by similar web of conductors 198 on the opposite side of the plate 182. The conductors 194, 197 and 198 may preferably be formed by a plating process, the openings 195 being "plated-through" holes to provide the conductors 194 which extend through the plate and which are thereby of hollow form. It will be understood that the invention is not limited to the use of a plating process to form the conductors and that the grounding conductors may be formed by other means.

Layers 197a and 198a of insulating material are provided on the outer surfaces of the web of conductors 197 and 198 on the opposite surfaces of the plate 182 to prevent direct electrical contact between the surfaces of such conductors and conductive traces of the interconnected circuit boards or wadded contact elements.

Figure 26:
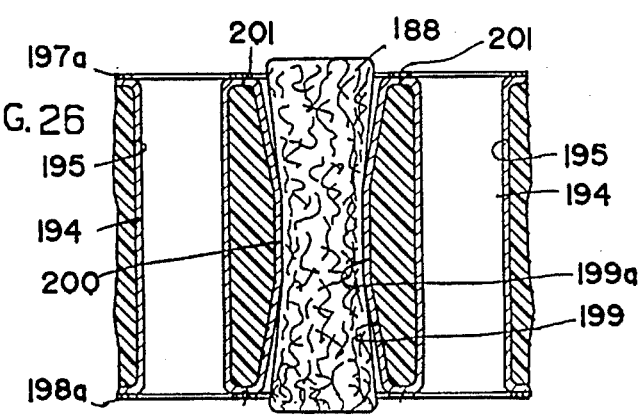
FIG. 26 is a cross-sectional view taken substantially along line 26—26 of FIG. 24 and is similar to FIG. 25 but illustrates a grounding interconnect device of the connector.

FIG. 26 shows the mounting of the device 188 which is one of the illustrated devices used to effect ground connections to the grounding structure associated with the plate 182. In this case, the device 188 is mounted in an opening 199 which is like the opening 164 and which has a narrowed neck portion 199a but which is in the form of an annular conductor 200 having an inside surface for direct electrical conductive engagement with the outer surface of the device 188. The opposite ends of the conductor 200 are surrounded by and connected to conductive layers 201 and 202 which provide an electrical connection to the web of conductors 197 and 198 on the opposite surfaces of the plate 182. They may be formed by a plating process used for forming the conductors 194, 197 and 198.

With the constructions of FIGS. 19–26, the configuration and relationship of each signal-propagating interconnect device to elements of the ground structure and dielectric material are the same as for every other signal-propagating device. As a result, the characteristic impedance, which is a function of the series inductance to shunt capacitance ratio along each path, is uniform as to all signal propagating paths of the connector. This feature is important for the reason that it facilitates another design in which the characteristic impedances of each path matches the characteristic impedances of the interconnected circuit board circuits to minimize highly undesirable reflections, standing waves and resonances which might interfere with signal propagation.

It will be understood that modifications and variations may be effected without departing from the spirit and scope of the novel concepts of this invention

What is claimed is:

1. An electrical connector assembly for propagation of electrical signals therethrough between opposite sides of said assembly, comprising: support means having opposite surfaces corresponding to said opposite sides, a plurality of spaced signal-propagating interconnect means extending through said support means between said opposite surfaces thereof and arranged in generally parallel relation to one another for interconnecting circuit components at said opposite sides of said assembly, ground conductor means included in said support means and having portions in adjacent relation to said signal-propagating interconnect means, ground interconnect means for connecting said ground conductor means to ground conductors of said circuit components, and insulating means of dielectric material included in said support means for supporting said signal-propagating interconnect means and in electrically insulated relation to adjacent portions of said ground conductor means to provide each supported signal-propagating interconnect means with an adjacent ground path of very low inductance and resistance to obtain efficient signal propagation between interconnected circuit components and to inhibit the build-up of any potential difference between such interconnected circuit components, said support means having a plurality of spaced openings extending between said opposite surfaces and arranged in a multi-directional array of openings into which said signal propagating interconnect means are disposed for selectively obtaining a desired pattern of propagation paths between said circuit components.

2. An electrical connector assembly as defined in claim 1, wherein said insulating means includes a member of insulating material having said multidirectional array of openings therethrough which receive said signal-propagating interconnect means, said ground conductor means being supported by said member of insulating material and including said portions which are in adjacent relation to said signal-propagating interconnect means and web means providing additional interconnecting portions which connect all of said portions which are in adjacent relation to said signal-propagating interconnect means.

3. An electrical connector assembly as defined in claim 2, said additional interconnecting portions of said web means being on the outside of said member of insulating material and having a layer of insulating material on the outside thereof for preventing direct contact with conductive pads and traces on said circuit boards.

4. An electrical connector assembly as defined in claim 2, said interconnecting portions of said web means being in two groups on opposite sides of said member of insulating material, said adjacent portions of said ground means extending through said member of insulation material and each being connected at opposite ends to said pair of interconnecting portions of said web means.

5. The connector as in claim 2 wherein said signal-propagating interconnect means include wadded conductor contact elements.

6. The connector as in claim 2 wherein said portions which are in adjacent relation to said signal-propagating interconnect means are plated openings.

7. The connector as in claim 6 wherein said plated openings are arranged in an array of openings in adjacent relation to said signal-propagating interconnect means.

8. An electrical connector assembly for propagation of electrical signals therethrough between opposite sides of said assembly, comprising: support means having opposite surfaces corresponding to said opposite sides, a plurality of spaced signal-propagating interconnect means extending through said support means between said opposite surfaces thereof and arranged in generally parallel relation to one another for interconnecting circuit components at said opposite sides of said assembly, ground conductor means included in said support means and having portions in adjacent relation to said signal-propagating interconnect means, ground interconnect means for connecting said ground conductor means to ground conductors of said circuit components, and insulating means of dielectric material included in said support means for supporting said signal-propagating interconnect means in electrically insulated relation to adjacent portions of said ground conductor means to provide each supported signal-propagating interconnect means with an adjacent ground path of very low inductance and resistance to obtain efficient signal propagation between interconnected circuit components and to inhibit the build-up of any potential difference between such interconnected circuit components, the spacing between each of said signal-propagating interconnect means and an adjacent portion of said ground conductor means being less that the spacing between each said signal-propagating interconnect means and any other of said signal-propagating interconnect means adjacent thereto and said adjacent portions of said ground conductor means extend in generally surrounding relation to each of said signal-propagating interconnect means to minimize signal coupling between each signal-propagating interconnect means and any other signal-propagating interconnect means adjacent thereto.

9. An electrical connector assembly as defined in claim 8, wherein each of said adjacent portions of said ground conductor means provides an annular surface of conductive material around each of said signal-propagating interconnect means.

10. An electrical connector assembly as defined in claim 9, wherein said ground conductor means includes a member of electrically conductive material having openings therethrough each providing an internal surface to define said annular surface of conductive material around each of said signal-propagating interconnect means.

11. The connector as in claim 10 wherein said insulating means includes a coating of insulating material positioned in said openings in said conductive material.

12. The connector as in claim 11 wherein said coating is plastic.

13. The connector as in claim 11 wherein said coating is teflon.

14. The connector as in claim 10 wherein said openings are arranged in an array of openings into which said signal-propagating interconnect means are disposed for selectively obtaining a desired pattern of propagation paths between said circuit boards and said ground interconnect means including means whereby at least one of said openings is a ground opening arranged to receive and support resilient and electrical conductive means for effecting a connection between circuit board ground conductors and said conductor means to provide said ground interconnect means.

15. The connector as in claim 14 wherein said insulating means is positioned in said openings in said conductive material to insulate said signal-propagating interconnect means.

16. The connector as in claim 15 wherein said signal-propagating interconnect means include wadded conductor contact elements and said ground interconnect means include wadded conductor contact elements.

17. The connector as in claim 10 wherein said insulating means includes an insulating insert positioned in said openings in said conductive material.

18. The connector as in claim 17 wherein said insulating insert is a plastic material.

19. The connector as in claim 10 wherein said openings are arranged in an array in said conductive material.

20. The connector as in claim 10 wherein said ground interconnect means includes a conductive insert positioned in at least one of said openings in said conductive material.

21. The connector as in claim 10 wherein said ground interconnect means including means whereby at least one of said plurality of spaced openings is a ground opening arranged to receive and support resilient and electrical conductive means for effecting a connection between circuit board ground conductors and said ground conductor means to provide ground interconnect means.

* * * * *

UNITED STATES PATENT AND TRADEMARK OFFICE
CERTIFICATE OF CORRECTION

PATENT NO. : 5,597,313
DATED : January 28, 1997
INVENTOR(S) : Richard J. Lindeman It is certified that error appears in the above-indentified patent and that said Letters Patent is hereby corrected as shown below:

In the cover page, item 75, the address of the inventor should read -- "Rancho Viejo, TX" --

In column 4, line 45, "plug an being" should read ---plug and being--.

In column 4, line 54, "theft" should read -- that --

In column 6, line 44, "ont" should read -- on --.

In column 7, line 4, "provide" should read -- provided --.

In column 7, line 46, "174" should read -- 17d --.

UNITED STATES PATENT AND TRADEMARK OFFICE
CERTIFICATE OF CORRECTION

PATENT NO. : 5,597,313
DATED : January 28, 1997
INVENTOR(S) : Richard J. Lindeman It is certified that error appears in the above-indentified patent and that said Letters Patent is hereby corrected as shown below:

In column 8, line 6, "bend" should read -- bent --.

In column 8, line 22, "18C and 18C" should read -- 18C and 18D --.

In column 8, line 25, "18A-a8C" should read -- 18A-18D --.

In column 8, line 27, "18A-18C" should read -- 18A-18D --.

In column 10, line 30, "which on" should read --which are on --.

In column 10, line 61, "so as minimize" should read -- so as to minimize --.

UNITED STATES PATENT AND TRADEMARK OFFICE
CERTIFICATE OF CORRECTION

PATENT NO. : 5,597,313
DATED : January 28, 1997
INVENTOR(S) : Richard J. Lindeman It is certified that error appears in the above-indentified patent and that said Letters Patent is hereby corrected as shown below:

In column 12, line 52, "a pair outwardly" should read -- a pair of outwardly --.

In column 14, line 21, "required one" should read --required. One --.

Signed and Sealed this

Sixteenth Day of December, 1997

*Attest:*

*Attesting Officer*

BRUCE LEHMAN

*Commissioner of Patents and Trademarks*